United States Patent
Moussa et al.

(10) Patent No.: US 6,630,009 B2
(45) Date of Patent: Oct. 7, 2003

(54) METALLIC FILLED PASTES

(75) Inventors: Khalil M. Moussa, Stevenson Ranch, CA (US); Kenneth J. Newell, Valencia, CA (US); Catherine Hinczewski, Stevenson Ranch, CA (US); Charles H. Zenuk, Stevenson Ranch, CA (US)

(73) Assignee: 3D Systems, Inc., Valencia, CA (US)

( * ) Notice: Subject to any disclaimer, the term of this patent is extended or adjusted under 35 U.S.C. 154(b) by 0 days.

(21) Appl. No.: 10/116,092

(22) Filed: Apr. 3, 2002

(65) Prior Publication Data

US 2002/0176793 A1 Nov. 28, 2002

Related U.S. Application Data

(63) Continuation-in-part of application No. PCT/FR01/02349, filed on Jul. 19, 2001.

(30) Foreign Application Priority Data

Jul. 20, 2000 (FR) ......................................... 2000 09513

(51) Int. Cl.[7] .............................. B22F 7/00; B22F 7/02
(52) U.S. Cl. ................................. 75/255; 419/5; 419/7; 419/23; 419/36; 419/54; 419/57; 419/60
(58) Field of Search ................................. 75/255; 419/5, 419/7, 36, 57, 60, 54, 23

(56) References Cited

U.S. PATENT DOCUMENTS

| | | | | |
|---|---|---|---|---|
| 3,929,476 A | * | 12/1975 | Kirby, Jr. et al. | |
| 5,397,383 A | * | 3/1995 | Wilczek et al. | 106/1.22 |
| 5,475,048 A | * | 12/1995 | Jamison et al. | 524/439 |
| 5,496,682 A | * | 3/1996 | Quadir et al. | |
| 5,745,834 A | * | 4/1998 | Bampton et al. | |
| 5,932,055 A | * | 8/1999 | Newell et al. | |
| 6,020,508 A | * | 2/2000 | Nikolic et al. | |

FOREIGN PATENT DOCUMENTS

| | | | |
|---|---|---|---|
| WO | WO 00/51809 | * | 9/2000 |
| WO | WO 02/07918 A1 | * | 1/2002 |

* cited by examiner

*Primary Examiner*—Daniel J. Jenkins
(74) *Attorney, Agent, or Firm*—Ralph D'Alessandro; William Simons

(57) ABSTRACT

A paste composition, including a binding agent charged with metallic powder, to be used in a solid freeform fabrication procedure, comprising:

a) a solidifiable binding agent comprised of at least one polymerizable resin, with a viscosity of less than 4000 mPa.s, measured at 25° C.;

b) at least one initiator, in a concentration greater than about 0.1% by mass with respect to the mass of the resin; and c) a mixture of at least two metallic powders, said mixture having a volumetric concentration greater than 40% with respect to the composition, wherein said mixture of metal powders is either i) a bimodal or trimodal mixture in nature, or ii) is a majority of stainless steel with an amount of NiB or NiP and combinations thereof effective to lower the sintering temperature.

31 Claims, 1 Drawing Sheet

Assessed Ni-P phase diagram.

Assessed Ni-P phase diagram.
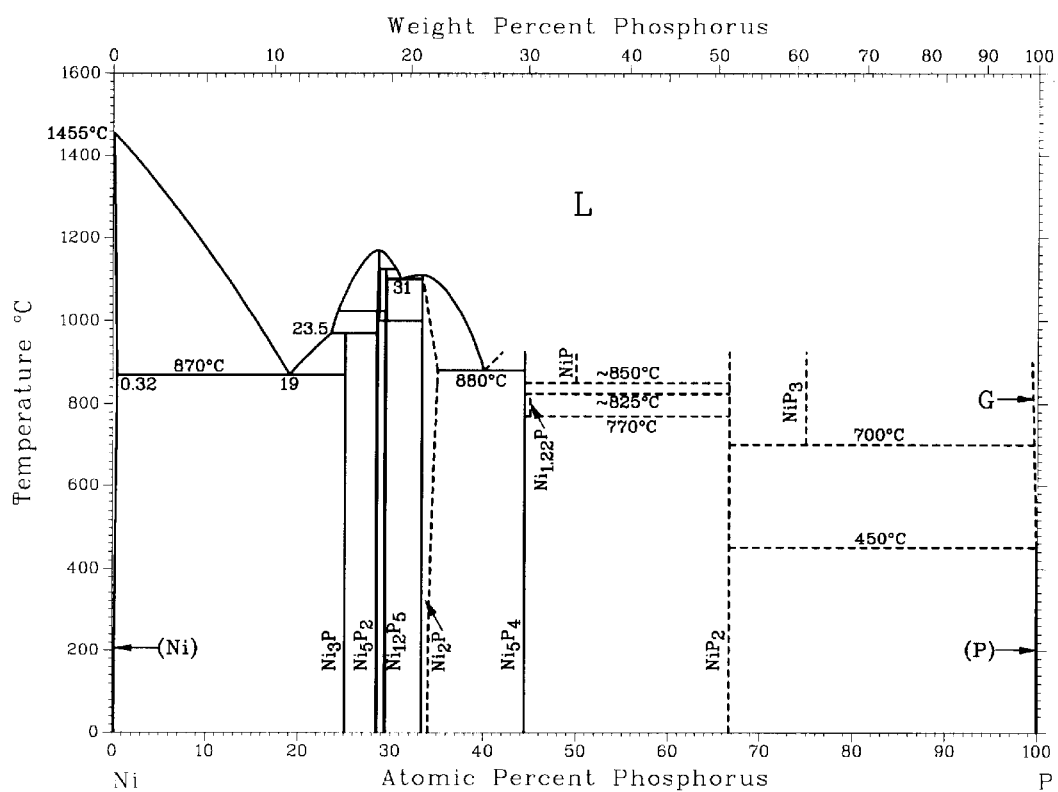

METALLIC FILLED PASTES

CROSS-REFERENCE TO RELATED CASES

This patent application is a continuation-in-part of Opto-Form SARL PCT patent application Ser. No. PCT/FR01/02349 entitled "Paste Composition Charged with Metallic Powder and Metallic Products Obtained from Paste Composition" that was filed on Jul. 19, 2001 and then published as PCT WO 02/07918 A1 on Jan. 31, 2002. This PCT Application claimed priority from French Patent Application No. 00/09513 filed Jul. 20, 2000. Both the above-noted priority PCT Application and the priority French Patent Application are incorporated herein by reference in their entireties.

BACKGROUND OF THE INVENTION

1. Field of the Invention

The present invention relates to a curable metallic paste composition suitable for the formation of three dimensional sintered bodies by rapid prototyping and manufacturing procedures. The procedures are additive in nature and create complex freeform solid objects directly from a computer model without part-specific tooling. Collectively the procedures can be termed solid freeform fabrication. The present invention also relates to a solid freeform fabrication procedure for obtaining these three-dimensional sintered bodies using this paste composition as well as the sintered body prepared by that procedure. In particular, this invention relates to a curable metallic paste composition and its use in the formation of three dimensional sintered bodies by solid freeform fabrication procedures, said paste composition containing a homogeneous mixture of (a) at least one binding agent comprised of at least one polymerizable resin, with a viscosity of less than 4000 mPa.s, measured at 25° C.; (b) at least one initiator; and (c) at least one specific type of metal powders. The paste may be either photocurable or thermally curable.

2. Description of the Relevant Art

The creation of three-dimensional parts with complex shapes in very competitive timeframes by rapid prototyping and manufacturing procedures is known in prior art. These procedures include using stereolithography machines that employ a photosensitive liquid material which may be cross-linked or polymerized by illumination from ultraviolet (UV) laser scanning for example, so-called laser sintering machines that employ a powder raw material whereby the powder may be locally bonded by a thermal effect from infrared (IR) laser scanning for example, or machines using heating filaments or cutting out sheets,.

Another process commercialized as the Keltool® process by the assignee of the present invention produces green parts from a stereolithography master, a mold, casting and infiltration. This process is disclosed in U.S. Pat. No. 3,929,476. This process, however, requires multiple steps and is time consuming to produce a near dense part. In addition to liquids, powders, filaments or sheets, there is another range of particularly interesting materials for rapid prototyping and manufacturing applications: highly viscous materials which are not deformed by the action of gravity without necessarily being solids, hereinafter referred to as pastes. These pastes are obtained by blending a solid charge in the form of a powder, for example, a mineral, metallic or ceramic powder, into a binding agent comprised of a photosensitive or heat-cured liquid resin, such as an acrylic or epoxy photopolymerizable resin traditionally used in stereolithography. The term paste covers, in particular, materials with a very high viscosity, greater than 10,000 mPa.s or the so-called "marked threshold" materials. A "threshold" material does not flow (zero gradient) as long as the shear limitation applied to it does not exceed a minimum value. A "marked threshold" is considered to be reached when the value of this shear limitation is greater than 20 Newtons per square meter.

For the formation of three-dimensional parts using these pastes, a layering or additive process is employed. The paste is spread in thin layers, with each layer being selectively solidified by a device emitting radiation, for example, a UV or IR laser, combined with galvanometric mirrors, as in stereolithography or laser sintering, respectively. Such pastes may be used for the manufacturing of metallic products by performing an additional thermal treatment after the above-mentioned formation stage. This treatment, comparable to that of parts obtained by a metal injection molding (MIM) type process, consists on one hand in eliminating the organic portion of the formed part, that is the polymer part and the potential thermodegradable additives, hereinafter referred to as "debinding," then in densifying the debinded part by sintering in order to obtain the desired mechanical properties.

However, current pastes do not allow for obtaining metallic products which present satisfactory properties. In fact, problems of cracking, swelling, bubbles or distortion appear during thermal treatment of parts formed from paste compositions and shrinkage phenomena during sintering have yet to be mastered.

In addition, it is known through U.S. Pat. No. 5,496,682 how to create sintered three-dimensional parts from a liquid composition presenting a viscosity preferably lower than 3000 mPa.s and not from a paste like the one described above, using a procedure similar to that described above, but adapted to an initially liquid composition. This patent relates essentially to the creation of parts sintered in ceramic as shown in the two examples presented. In order to maintain a good ability to flow, which is necessary for the described procedure, while maintaining a sufficient powder content, the initial liquid composition includes a photopolymerizable resin with a low viscosity, on the order of 70 mPa.s for the resin used in Example 1 and on the order of 5 mPa.s for the resin used in Example 2, and must necessarily include a dispersant.

BRIEF SUMMARY OF THE INVENTION

Therefore, one aspect of the present invention is directed to a paste composition, including a binding agent charged with metallic powder, to be used in a solid freeform fabrication procedure, comprising:

a) a solidifiable binding agent comprised of at least one polymerizable resin, with a viscosity of less than 4000 mPa.s, measured at 25° C.;

b) at least one initiator, in a concentration greater than about 0.1% by mass with respect to the mass of the resin; and c) a mixture of at least two metallic powders, said mixture having a volumetric concentration greater than about 40% with respect to the composition, wherein said mixture of metal powders is either i) a bimodal or trimodal mixture in nature, or ii) is a majority of stainless steel with an amount of nickel boron (NiB) or nickel phosphate (NiP) compositions and combinations thereof effective to lower the sintering temperature.

Another aspect of the present invention is directed to a process for obtaining metallic products from the above-noted paste composition in comprising the steps:

a) forming a composite product comprised of thin superimposed layers of the above-noted paste, obtained by the repetition of a cycle including the following operations:
   transforming the layer which was just created by polymerizing the binding agent, and
   coating the transformed layer by a new non-transformed layer,
b) removing the polymer contained in the composite product obtained in the preceding step a) by a thermal treatment called the debinding step, and
c) sintering the debinded metallic product obtained in the preceding step b).

Still another aspect of the present invention is directed to a debinded and sintered metallic product obtained by the above procedure.

The metallic products obtained from the present invention permit a green part to be obtained without the time consuming steps of producing a master pattern, using a mold such as a curable silicone rubber in a room temperature vulcanizing (RTV) process, and casting. The metallic parts produced from the present invention can be sintered and infiltrated to near full density.

DETAILED DESCRIPTION OF THE DRAWING

These and other aspects, features and advantages of the invention will become apparent upon consideration of the following detailed disclosure of the invention, especially when it is taken in conjunction with the accompanying drawings wherein:

FIG. 1 is a phase diagram of Ni-P.

DETAILED DESCRIPTION OF THE INVENTION

The term "bimodal" when referring to mixtures of metals in a paste composition as used in the present specification and claims refers to any metal powder mixture useful for the formation of three dimensional sintered bodies by prototyping or rapid manufacturing procedures that contain metals having two modes of particles having sizes that are substantially different. Preferred bimodal mixtures include a mixture of metals having a primary mode of average particle sizes having about +20 to about −50 μm and a secondary mode of average particle sizes of about +0.5 μm to about −15 μm. Most preferably, the primary and secondary modes are in a ratio of 5:1 to 10:1, most preferably about 7:1.

The term "trimodal" when referring to mixtures of metals in a paste composition as used in the present specification and claims refers to any metal powder mixture useful for the formation of three dimensional bodies by prototyping or rapid manufacturing procedures which can employ sintering and that contain metals having three modes of particles having sizes that are substantially different. Preferred trimodal mixtures include a mixture of metals having a primary mode of average particle sizes having about +20 to about −50 μm along with a secondary mode having about +5 to about −15 μm particle size and a tertiary mode having about +0.5 μm to about −2.5 μm particle size.

The paste composition according to the present invention includes at least one thermal or photopolymerizable or photosensitive resin, in combination with at least one thermal initiator or photoinitiator, also charged with a mixture of metallic powders described above. The binding agent used in this invention preferably presents a viscosity of less than about 4000 mPa.s (at 25° C.) and the composition prepared from this agent and the metallic powder preferably with respect to photopolymers has a reactivity of at least 5 $mm^3/s/W$ with respect to illumination, for example, an ultraviolet type illumination. The composition's reactivity is clearly a function of the type of binding agent, but also is a function of the initiator and the metallic powder used. In the case of a resin, which is photopolymerizable by ultraviolet light, the composition's reactivity will vary on the order of 5 $mm^3/s/W_{UV}$ up to 40 $mm^3/s/W_{UV}$ in the optimum wavelength field for the composition.

Different types of acrylate photopolymerizable resins activated by ultraviolet radiation are preferably used in this invention, in particular a tetra-functional acrylate resin such as ditrimethylol propane tetraacrylate resin, marketed by the company Cray Valley under the trade name "Sartomer SR 355" hereinafter referred to as "SR 355." It is essential to reach high powder loading or charge rates in the resin (at least 50% by volume but preferably up to 70% if possible) for improved control of the geometry of the sintered parts and accelerated sintering. The low viscosity of this "SR 355" resin on the order of 700 mPa.s, allows for high powder charge rates to be reached and the increased efficiency of the various additives described below, in particular that of a rheological control agent. The tetra-functional nature of this "SR 355" resin makes it highly reactive to ultraviolet radiation, with an appropriate initiator, even when it is highly charged with metallic powder.

A dipentaerythritol pentaacrylate resin, marketed by the company Cray Valley under the trade name "Sartomer SR 399" may also be used in the paste composition according to the invention. This resin presents high reactivity, but its high viscosity (10 times more viscous than the above-mentioned resin "SR 355") prevents its use alone without a diluent in the event that the metallic powder charge exceeds a certain percentage.

In order to reduce the viscosity of the resin, it is possible to add a specific quantity of a more fluid resin known as a diluent. This diluent, preferably reactive (that is, it will create a cross-linked network under the influence of the light or heat, like the resin), has a viscosity of lower than 100 mPa.s and is incorporated in concentrations of between about 2 and about 20% by mass with respect to the resin. It allows for the increase of the volumetric rate of powder (by a few percentage points) and improves the efficiency of a Theological control agent, which provides the paste with a Bingham fluid type performance (a very high flow threshold). In the case of a highly reactive "SR 355" resin, this may be diluted with about 2 to about 20% of more fluid resins, such as those marketed by the company Cray Valley under the trade name "SR 256" (2-(2-ethoxyethoxy)ethyl acrylate) which has a viscosity of 5 mPa.s or "SR 9003" (neopentyl glycol dipropoxyle diacrylate) which has a viscosity of 17 mPa.s, to provide a resin which remains highly reactive with a viscosity on the order of 400 mPa.s. Other resins more fluid than the SR 256 resin, such as those marketed under the trade names "SR 531" (cyclical formal trimethylolpropane acrylate), "SR 454" (trimethylolpropane triethoxylate triacrylate), or "SR 494" (pentaerythritol tetraethoxylate tetraacrylate) may also be used. The composition according to the invention may include a blend of resins containing at least about 50% "SR 355" resin and at most about 50% of more fluid resins used as diluents, in which about 2 to about 20% are reactive resins such as those mentioned above, with the remainder comprising non-reactive resin(s).

The functionality and viscosity of various acrylates useful as resins or diluents are as follows:

| Commercial name of the resin | Functionality | Supplier | Viscosity (cps) @ 25° C. |
|---|---|---|---|
| Diacryl 101 | Diacrylate | Akzo | 2150 |
| RPC550 | Diacrylate | RPC | 1500 |
| SR349 | Diacrylate | Cray Valley | 1700 |
| SR454 | Triacrylate | Cray Valley | 70 |
| SR355 | Tétraacrylate | Cray Valley | 700 |
| SR494 | Tétraacrylate | Cray Valley | 150 |
| SR399 | Pentaacrylate | Cray Valley | 14000 |
| SR508 | Diacrylate (diluent) | Cray Valley | 8 |
| SR256 | Monoacrylate (diluent) | Cray Valley | 5 |
| SR9003 | Diacrylate (diluent) | Cray Valley | 17 |

Appropriately, the resin used in the compositions does not contain a benzene ring. This lack of a benzene ring has many beneficial effects. It facilitates the elimination of the polymer during debinding. In fact, it seems that this lack of a ring favors the breakdown into gaseous substances of a small size (while, on the contrary, the benzene ring is not "broken" during the treatment and creates constraints during its diffusion through the product). In addition, a resin lacking a benzene ring according to the invention allows for a low rate of carbon residue, below 2%, preferably below 0.5% by mass with respect to the mass of resin after thermal breakdown during the debinding stage. In this case using the "SR355" resin, a carbon residue on the order of 0.4% is obtained. For the sake of comparison, pastes with compositions similar to those of the invention but including a diphenol type resin have much higher carbon residue. For example, using a resin marketed by the company Akzo under the trade name Diacryl (diphenol A ethoxylate dimethacrylate) with "SR 349" (diphenol A ethoxylate diacrylate), the pastes have carbon residues of 1.1% and 4.2%, respectively. The low carbon residue of the "SR355" decreases the risk of heterogeneity of composition in the finished metallic product, in particular due to the formation of carbides. This property, which seems to be due primarily to the absence of an aromatic ring makes an important contribution to the control of deformations and a better control of shrinkage during sintering. Shrinkage indicates the reduction of the volume of the parts, which accompanies their densification during sintering. In fact, trials have shown that the shrinkage, during sintering, of a part made from the paste composition according to the invention, is practically isotropic (identical linear shrinkage in all three spatial directions) while this was not the case with resins which have a benzene ring. It is also useful to limit the percentage of residual carbon to obtain good mechanical properties in the finished parts. For example, in the case of steel powder, a lower quantity of residual carbon, better distributed in the structure of the metal, runs a lower risk of diminishing the strength of the sintered parts since the carbon tends to form carbides (of chromium, molybdenum and the like) which, positioning themselves around the grains of steel, weaken the structure of the metal. Of course, the higher the percentage of carbon residue, the greater the risk of disrupting the initial composition of the steel.

Trials have shown that the problem of cracking or swelling often encountered during thermal treatment of pastes using other resins is definitively resolved with the use of a resin such as the one defined above. In addition, in order to avoid the above-mentioned problems, the heating speeds, which should be limited to 0.05° C./min during debinding in the degradation zone of the polymer with the above-mentioned paste compositions, may be increased at least up to 0.1° C./min, or even to 0.2° C./min for an equivalent quality. Such trials have been performed on parts with walls of up to 8 millimeters thick, and have not shown the slightest typical debinding problem. The charge does not seem to play a significant role during the debinding since trials with other charges have yielded similar results. These observations clearly only remain valid if the quantity of polymer to be eliminated during debinding is not too high with respect to the quantity of the remaining charge, so the debinded part has a sufficient content.

The composition includes an initiation system with an initiator, such as a photoinitiator. In the case of resins sensitive to ultraviolet light, such as the above-mentioned polyacrylate resins, the photoinitiator may be comprised of one of the photoinitiators which absorb the wavelengths of the Argon laser (351–364 nm) marketed by the company Ciba-Geigy under the trade names "Irgacure 369" (2-benzyl-2-dimethylamino-1-(4-morpholinophenyl)-butanone-1), "Irgacure 651" (2,2'-dimethoxy-2-phenylacetophenol), "Irgacure 1700", "Irgacure 819" or "Darocur 1173." Preferably, the photoinitiator belongs to the α-amino-ketone family, since the composition's highest reactivity is obtained with the initiator marketed under the trade name "Irgacure 369." Mixtures of photoinitiators can be used. One suitable mixture is Irgacure 369 (1% wt/resin) and Irgacure 819 (0.2% wt/resin) or any other mixtures that are suitable for energy transfer.

It is also possible to use a resin and a photoinitiator (such as the one marketed under the trade name "Irgacure 784DC" or "Irgacure 1700"), which allows for work with visible light, using a machine equipped with a device emitting rays of light in the visible spectrum.

It is also possible to use a resin and a thermal initiator. An example of a material useful in achieving latent polymerization is an epoxy with a protected amine group that decomposes in response to light or heat. Thermal polymerization is achieved by use of an appropriate thermal initiator, such as a peroxide based initiator. WAZO materials available from E. I. du Pont de Nemours & Company are examples of one type of suitable thermal initiators. Thermal initiators are activated by exposure to infrared (IR) radiation. Other thermal initiators are azo-bis-iso-butyronitrile thermal initiators available commercially from Electron Microscopy Sciences of Fort Washington, Pa. and Azo initiators VA-044, VA-057, VA-085, VA-070 and VA-096 available from Wako Specialty Chemicals, Ltd.

Certain salts may also be employed as thermal initiators in order to supply cations which initiate cationic curing upon heating. Onium and pyridinium salts provide cationic species that will initiate thermal curing in epoxide compounds, such as compounds based on styrene oxide moieties linked to organic molecules, oligomers or polymers. N-benzylpyridinium and related quaternary ammonium salts provide acidic species under heating conditions. A key in achieving successful thermal initiation of curing is that the linked moieties do not hinder the cationic polymerization of the epoxy functionality by steric interaction or by the action of a Lewis base. Such reactions are discussed in greater detail in U.S. Pat. No. 6,020,508 issued Feb. 1, 2000. Other routes capable of liberating cationic species that will achieve the ring-opening polymerization of styrene oxides are also known.

The initiation system may also include an activation agent, which allows for the movement of the activation wavelength of the photoinitiator, which, once activated, will react with the resin. As an example, in the case of an ultraviolet photoinitiator, such as Irgacure 369, the activation agent may be chosen from among isopropyl thioxanthone, 1-chloro-4-propoxythioxanthone, or 4-benzoyl-4'-methyldiphenyl sulfide, in combination with a co-initiator such as ethyl p-dimethylaminobenzoate.

The volumetric concentration of the metallic powder in the composition according to the invention is preferably greater than about 50%. Such a volumetric concentration is possible with the use of a resin as defined above, potentially with additives such as those described below. This high percentage permits a sufficient dimensional control after sintering. The metallic powder preferably includes at least about 30% by volume of spherical particles to allow for the increase of the maximum volumetric concentration of powder in the composition and to favor the densification during sintering. The maximum volumetric concentration is the powder concentration for which the composition's viscosity becomes infinite. In practice, we speak of maximum volumetric concentration in powder, the concentration beyond which it becomes difficult to create homogenous blends by traditional means (blenders) considering the influence of the additive on the formulation.

Preferably, the powder presents a particle size (average particle diameter) of under 45 μm, not only due to the thicknesses of the layers used in a prototyping procedure, but also due to its better sintering performance. It is also possible to use powders with smaller particle sizes, for example, a particle size of less than 10 μm, similar to that used in MIM procedures, in order to limit the problems of deformation encountered during sintering. In addition, the use of a very fine powder allows for a better homogenization of the composition and better control of densification.

A homogenous blend of powders, of the same type or otherwise, with adapted particle size and in adequate concentrations may be used in order to significantly increase the maximum volumetric concentration in powder and improve densification control. Such an increase may be obtained since the finest particles may be positioned in the voids left by the largest particles, that is, since the ratios of particle diameters is on the order of 1:7. For example, in the case of steel particles, the use of an iron powder derived from an iron carbonyl, with a finer particle size than that typical of steel, improves the densification thanks to the presence of fine particles and limits the deformations thanks to a higher concentration of steel. In addition, the strength of the metallic product may also be improved thereby.

Different powders have been tested in combination with a single resin, for example resin type "SR 355."

Supersolidus Liquid Phase Sintering

Homogeneous metal powder blends may be made from mixtures of iron, stainless steel, titanium, titanium alloy, copper, tungsten, tungsten carbide, nickel alloy, nickel boron and nickel phosphorus. In these blends, it is preferred that each of the metal powders used be less than about 50 microns in average particle size, more preferably, less than 45 microns in average particle size, while being bimodal or trimodal in nature. One preferred blend is to use a majority of stainless steel (i.e., greater than 50% by weight or more than 50 parts per hundred) while using minority proportions (i.e., less than 50% by weight in total) of carbonyl iron, nickel boron (NiB) and/or nickel phosphorus (NiP). As evidenced in the phase diagram in FIG. 4 of U.S. Pat. No. 5,932,055, boron and nickel will exist in a solid state as $Ni_4B_3$, NiB, $Ni_2B$, and $Ni_3B$ below 1018° C. when the boron concentration is selected so the transition between the supersolidus and liquid regions follows a steep gradient that provides the driving force necessary for complete diffusion.

When the temperature is raised above 1050° C., NiB is liquid and the diffusion couple is a combination of solid and liquid phase, or supersolidus. The liquid phase rapidly wets all of the nickel particles, further enhancing NiB diffusion and causing strong Ni—Ni necks between particles. Eventually the boron is equilibrated as solid $Ni_3B$ below 1095° C. As the temperature is increased above 1095° C., the remaining intermetallics melt and cause rapid supersolidus liquid phase sintering because the melted intermetallics easily coat the grain boundaries. NiP exhibits similar phase characteristics, but at lower temperatures as shown in the phase diagram in FIG. 1.

Two particularly preferable blends are (1) mixtures of about 70 to 97 parts per hundred of stainless steel (which preferably has an average particle size of about 20 to about 50 microns) with about 1.0 to 10 parts per hundred NiB (which preferably has an average particle size of about 5 to about 15 microns) and about 1 to 10 parts per hundred of NiP (which also preferably has an average particle size of about 5 to about 15 microns) and about 1 to 15 parts per hundred of iron (which preferably has an average particle size of about 0.5 to about 2.5 microns) or (2) the same mixture without the iron added.

The preparation of these preferred blends is similar to that disclosed in the Supersolidus Liquid Phase Sintering (SLPS) process shown in U.S. Pat. No. 5,932,055 and the blends disclosed in the freeform fabrication of metallic parts disclosed in U.S. Pat. No. 5,745,834, both assigned to Rockwell Science Center LLC. Both of these U.S. Patents are incorporated herein by reference in their entireties. Generally, the powder blend is heated and the interstitial boron from the NiB will segregate to interparticle grain boundaries resulting in locally elevated boron concentrations (B>5wt %). Once the alloy is raised above the solidus temperature for the locally elevated concentration of boron, a liquid film forms along the grain boundaries and particle necks. This liquid phase promotes grain boundary sliding of the polycrystalline particles. The disintegration of particles allows rapid densification due to surface tension forces and capillary pressure. As the liquid reprecipitates the grains themselves deform to assist in pore removal and final densification.

It is interesting to note that this densification process has no transport mechanism other than viscous flow. Rather, it entails a localized breakdown of particle structure, which ultimately enables full densification without part distortion.

In addition to NiB (with B>5 wt %), a nickel phosphorus alloy NiP with high phosphorus concentration (P>11 wt %) can be blended to introduce a Transient Liquid Phase (TLP) sintering mechanism to compliment the boron activated Supersolidus Liquid Phase Sintering (SLPS). The combination of these mechanisms enables the rapid fabrication of functional parts with 25μ-inch finish, HRc-22, 200 ksi strength and no measurable sintering distortion. The NiP (P>11 wt %) forms a liquidus phase at approximately 930° C. that wets the internal pores and surfaces of the metal pre-form. The internal wetting of the pre-form assists the solid-state diffusion of the boron into the steel that facilitates a 1050° C.–1075° C. full density Supersolidus Liquid Phase Sintering.

With the addition of both NiB (B>5 wt %) and NiP (P>11 wt %), there is a need to increase the iron content of the powder blend to more closely resemble the composition of steel. As such, ultrafine 2 μm iron powder was added. This iron (Fe) powder also improves surface finish while reducing sinter shrinkage by acting as a third packing mode.

Suitable metal powders for use in the present invention include the following:

| Reference | Particle Nature | Particle Type | Particle Size (in μm) | Reactivity (in mm³/s/ $W_{UV}$) |
|---|---|---|---|---|
| 316L | stainless steel | spherical | <22 | ~5 |
| 316HIC | | spherical | <44 | ~35–40 |
| 316LF | | non-spherical | <44 | ~35–40 |
| Ti | titanium | non-spherical | <44 | ~35–40 |
| TA6V | titanium alloy | spherical | <44 | ~35–40 |
| TA6V | | non-spherical | <44 | ~35–40 |
| Ni | nickel alloy | spherical | <44 | ~35–40 |
| Cu | copper | spherical | <44 | ~35–40 |
| 17-4PH-1 | stainless steel | spherical | +20/−44 | ~35–40 |
| 17-4PH-2 | stainless steel | spherical | <20 | ~0–5 |
| 17-4PH-3 | stainless steel | spherical | <15 | ~0–5 |
| 17-4PH-4 | stainless steel | spherical | +44/−90 | ~35–40 |

Composition of referenced powders in % by mass:

316L: chromium (16.5 to 20%); nickel (8 to 14%); molybdenum (2.5 to 3.5%); carbon <300 ppm; iron (~62.5 to 73%)

316 HIC: chromium (16.5 to 20%); nickel (8 to 14%); molybdenum (2.5 to 3.5%); carbon 0,14%; iron (~62.5 to 73%)

TA6V: aluminum (6%); vanadium (4%); titanium (90%)

17-4 PH: iron (~65%); chromium (16.0 to 125%); nickel (3.8 to 5.0%);

copper (3.4 to 4.5%); niobium (0.2 to 0.4%); manganese (0.14 to 0.5%);

silicon (0.54 to 0.7%)

Preferred bimodal and trimodal mixture of metal powders include:

| RMF1 | 17-4PH +20/−44 μm | 60 parts per hundred (pph) |
|---|---|---|
| | 17-4PH - 5 μm | 20 pph |
| | Fe - 2 μm | 10 pph |
| | NiB - 12 μm | 2.5 pph |
| | NiP - 5 μm | 7.5 pph |
| RMF2 | 17 - 4PH +20/−44 μm | 80 pph |
| | Fe - 2 μm | 10 pph |
| | NiB - 12 μm | 2.5 pph |
| | NiP - 5 μm | 7.5 pph |
| RMF3 | 17-4PH +20/−44 μm | 80 pph |
| | Fe - 2 μm | 10 pph |
| | NiB - 44 μm | 2.5 pph |
| | NiP - 44 μm | 7.5 pph |
| RMF4 | 17-4PH +44/−90 μm | 70 pph |
| | 17-4PH-15 μm | 30 pph |
| RMF5 | 17-4PH +20/−44 μm | 90 pph |
| | NiB - 44 μm | 2.5 pph |
| | NiP - 44 μm | 7.5 pph |
| RMF6 | 17-4PH - 20 μm | 70 pph |
| | 17-4PH - 5 μm | 10 pph |
| | Fe - 2 μm | 10 pph |
| | NiB - 12 μm | 2.5 pph |
| | NiP - 5 μm | 7.5 pph |
| RMF7 | 17-4PH +20/−44 μm | 90 pph |
| | NiP - 44 μm | 10 pph |

The importance of spherical particles has been verified on very different materials. In all cases, the use of a spherical particle powder has led to better results. In the case of stainless steel, for the same metal and a different particle size, trials have shown that, for similar rheological performance, the maximum volumetric concentration goes from about 44% for 100% non-spherical particle powder to about 63% for 100% spherical particle powder.

The theoretical maximum volumetric concentration which may be obtained with a stack of perfect spheres is about 74% by volume. For stainless steel with a density of approximately 8 grams per cubic centimeter, this maximum concentration corresponds to a quantity by mass on the order of about 95% (this concentration depends on the density of the resin). As an example, the composition includes about 91% by weight, or about 58% by volume of stainless steel powder; this concentration may be increased up to the maximum volumetric concentration, which is on the order of about 63%. For titanium with a density of approximately 4.5 grams per cubic centimeter, the maximum volumetric concentration represents a quantity by mass on the order of about 92%. As an example, the composition includes about 83% by weight, or about 55% by volume, of titanium powder; this concentration may be increased up to the maximum volumetric concentration, which is on the order of about 60%.

One of the conditions which must be met to use the composition in a rapid prototyping or rapid manufacturing procedure such as the one described in the present invention, is the reactivity of the composition, since it is subjected to ultraviolet radiation. The introduction of charges such as metallic powders strongly diminishes the penetration of light into the composition since part of this radiation is absorbed by the powder and is no longer available for the photopolymerization reaction. This causes two major problems: on one hand, the depth of the polymerization is so low that it is impossible to maintain a layer thickness on the order of 100 μm which is traditional in liquid stereolithography; on the other hand, the scanning speeds are much slower than those used to polymerize liquid resins. As an example, with an ionized argon laser (351 and 364 nm UV rays), the volumetric reactivity goes from approximately 600 mm³/s/W for an uncharged liquid resin to approximately 5 mm³/s/W for a composition based on the same resin and including approximately 58% by volume of spherical steel particles (<22 μm).

In order to improve the paste's reactivity when employing photopolymerization, the particles may be coated with a specific compound, which modifies the optical properties of the powder and the performance of the paste in the presence of ultraviolet radiation. This compound, comprised of a coat of a specific thickness, must serve as a screen to avoid the absorption of the light by the particle. To do this, it must be less absorbent than the metallic particle which serves as its support (at least two times less; it may not be absorbent at all); it may also have a refractive index such that the impinging light is reflected and/or diffused in the dispersant medium (the resin). The role of this compound is to allow for the "recovery" of the radiation normally absorbed by the powder and make it available for the resin (actually the initiator) and the polymerization reaction. This contributes to the significant improvement of the composition's reactivity. This compound may be a wax, for example, with the additional advantage that it completely degrades without residue. This wax could be polyethylene or polyamide.

The coating may also be a layer of oxides formed on the surface of the metallic particles. This layer of oxides must be sufficiently thick to modify the performance of the powder with respect to the ultraviolet radiation. Of course, the level of the oxidation must be perfectly controlled since an overly oxidized powder will not sinter well. In addition, this layer of oxidation may contribute to a more efficient elimination of the carbon during debinding.

The composition may also include a compound which increases its reactivity with respect to the illumination. This compound may be added to the resin (dissolved in the resin or not) and/or, as described above, it may be a coating compound for the particles forming the metallic powder. This additive is, for example, a polyethylene wax.

Of course the nature of the powder is not limited to the above examples, and may be made, for example, of carbon steel, tungsten, tungsten carbide, tungsten-cobalt carbide alloy, nickel alloy, chrome alloy, or copper alloy particles and the like.

The fact of adding charges, specifically metallic charges, in a liquid medium often causes problems of powder particle sedimentation. In the case of steel (density on the order of 8 grams per cubic centimeter), this is translated into a very rapid decantation of the particles and prevents the use of a blend in a procedure such as the one described in the present invention. In fact, a powder sedimentation during storage of the paste or during formation leads to a heterogeneity of the composition, primarily in the vertical direction, which over the course of thermal treatment, is translated into differential shrinkage causing distortions or deformations. The composition according to the invention may include different additives, which strongly limit sedimentation. Such an additive must modify the rheology of the blend in such a way that the paste obtained presents a very high flow threshold and a low viscosity at significant shear rates (Bingham type fluid performance or threshold shear thinning). Thus, the sedimentation is limited when the paste is at rest since its viscosity diminishes during manufacturing to facilitate the spreading of the layers. A Theological control agent may be added to the resin, for example by dispersion or dissolution under agitation and heating in the resin. This rheological control agent may be chosen from among polyamide wax-based compounds or hydrogenated castor or urea oil. This is, for example a polyamide wax, such as the one marketed by the company Kusomoto Chemicals under the trade name "Disparlon 6650" or the one marketed by Cray Valley Ltd., Waterloo Works, Machen, Caerphilly, UK under the trade name "Cray Vallac Super," or the one marketed by the Cabosil Division of Cabot Corporation in Tuscola, Ill. under the trade name "CabOSil T-720." Concentrations from about 1 to about 15% by mass with respect to the mass of the resin results in a fluid paste or gel to which the metallic powder is added. The paste obtained presents a high flow threshold and a low viscosity at high shear rates. The addition of this rheological control agent prevents sedimentation of the powder during storage or formation which would lead to heterogeneity of the composition, primarily in the vertical direction, which during sintering would translate into differential shrinkage causing distortions or deformations. In addition, such an additive allows consideration of paste compositions including metal powders which are denser than steel with a density of 8 grams per cubic centimeter, or copper with a density of 9 grams per cubic centimeter, such as tungsten with a density of 19 grams per cubic centimeter, or tungsten carbide with a density of 16 grams per cubic centimeter.

If the compatibility between the powder and the liquid medium (resin) is poor (due to the very different natures of these compounds) and/or if the wetting of the liquid on the particles is poor (surface state of the particles, surface tension of the liquid too high with respect to that of the surface of the particles), there will be poor adhesion of the resin to the particles, which results in a heterogeneous blend and the poor mechanical strength of the composite parts manufactured from the composition. An additive improving the cohesion of the blend is added to the formulation to improve the homogeneity of the blend, increase the strength of the composite parts and increase the maximum volumetric concentration of powder (powder loading) while not negatively affecting recoating performance during manufacturing (decrease of volume of air trapped in the system). It is preferable that this not modify or have very little effect on the reactivity of the composition. Thus, it allows for better control of shrinkage and deformations during thermal treatment.

This additive may be a so-called coupling agent compatible with the resin in order to avoid the formation of lumps, for example a silane type coupling agent such as the one marketed by the company Witco under the trade name "Silquest A-1120," in concentrations from about 0.1 to about 0.3% by mass with respect to the mass of the metallic powder.

This additive may also be a wetting and/or dispersant agent which modifies the surface tension of the liquid surface and/or creates a screen (electrostatic or steric) around the particles in order to keep them separated from each other and avoid bonding problems which lead, in turn to sedimentation of the particles and the decrease of the maximum volumetric concentration. Such additives form strong interactions (such as chemical absorption) between the liquid and the powder. For example, this could be a wetting and dispersant agent, present in a concentration of under 1%, preferably below about 0.5% by weight with respect to the weight of the metallic powder, such as those marketed by the company Lucas Meyer under the trade names "Forbest H60" and "Forbest 610" or that marketed by the company Byk Chemie under the trade name Disperbyk 111.

This additive may also be a lubricant, as is commonly used in the metal injection molding (MIM) process, such as stearic acid or the metallic derivatives of stearic acid. Such a lubricant, which has an action similar to that of a wetting/dispersant agent without, however, creating such strong interactions, permits the increase of the maximum volumetric concentration in powder of the composition. However, it must be noted that it significantly reduces the reactivity of the paste. It must be added in a low concentration: less than about 0.5% with respect to the mass of the metallic powder.

This additive may also be an adhesive agent, such as a resin possessing a known adhesive power on metallic substrates. It may be added to the resin forming the bonding agent in order to improve the wetting between the binding agent and the metallic powder. As an example, this adhesive agent could be one of the resins marketed by Cray Valley under the trade names "SR 705" (polyester acrylate), "SR 9050" (acid monoacrylate), "SR 9051" (acid triacrylate) or a blend thereof.

Additives in the form of a metallic powder with melting points below the sintering temperature of the metallic powder, may be added in order to induce a liquid phase sintering. They contribute to the homogenization of the composition during sintering and lead to a greater densification and more controlled shrinkage. The sintering temperature and/or the duration of the stage are also reduced since the liquid phase sintering process is faster. Some of these additives may partially compensate for the shrinkage caused by the densification (we speak of "swelling" due to the liquid phase) and lead to lower shrinkage than in the absence of the additive. As an example, in the case of a steel particle powder, this metallic additive may be comprised of a copper, aluminum or boron powder. Adapted concentrations of this additive result in a sintering with a minimum of shrinkage and/or improved properties and/or improved dimensional control. In the case of steel this concentration may range from about 0.2% by weight boron with respect to the mass of the steel, when boron is used, up to about 30% by weight when copper or a derivatives, such as bronze, is used. Given its homogenization role, the liquid phase sintering may contribute to the formation of new alloys with new physical properties, which may be adjusted as a function of the desired application.

The formation of the three-dimensional composite product from the paste according to the invention, may be performed by a prototyping or rapid manufacturing machine ("OptoForm" type), such as the one described in French Patent Application No. 99 02719, filed by OptoForm SARL. The formation of the three-dimensional product is obtained by the placement paste material by means of a recoater mechanism and the polymerization of superimposed thin layers of the paste material by means of ultraviolet light exposure. Due to a reactivity lower than that of the resins traditionally used in stereolithography, with which the thickness of the polymerized layer allows for work with layers of a thickness equal to about 150 $\mu$m (or even thicker), the formation of a composite product from a paste composition according to the present invention is performed with a layer thickness of less than about 150 $\mu$m, varying for example from about 25 to about 50 $\mu$m depending on the metallic powder used. The speed of movement of the light may be similar to that used in stereolithography and thus can reach several meters per second, since the fact that the layer is thinner does not prevent working at high speeds. Thus, with an "OptoForm" type machine, manufacturing times comparable to those of other rapid prototyping techniques can be achieved.

Considering the high viscosity of the metallic paste, the average strength of the composite parts after polymerization and the low thickness of the layers used, it is necessary to generate specific supports when the layer just placed must present portions to be hardened which extend beyond the hardened portions of the lower layer. These specific supports are comprised of points, segments, lines, solidified surfaces (called support elements), distributed in the field formed by the layer placed in such a way that their density is such that, in a radius of less than 1.5 mm, there are at least two points pertaining to two distinct, solidified support elements. In comparison, in the case of uncharged liquid formulations, this density is generally greater than about 2.5 mm, and often 10 mm.

The debinding treatment of the three-dimensional composite part may be performed by a liquefied neutral or reduction gas system to avoid oxidation. It is preferable to perform the debinding under vacuum (since the pressure is lower than the vapor pressure of the organic compounds, the breakdown takes place by diffusion and evaporation of small gaseous molecules rather than by "cracking"; this limits the constraints causing cracks and swelling). In this case, it is necessary to use a special airtight assembly that can withstand temperatures on the order of 600° C., including condenser systems, dust and vapor traps in order to minimize the fouling of the treatment kiln and vacuum pump. This assembly has proven very effective for most resin systems, in particular in the case of an "SR 355" type resin for which a liquefied gas or even air debinding (for charges that do not oxidize in air, such as ceramic charges for example) may be considered. The thermal cycle of the debinding may be optimized, depending on the decomposition atmosphere, by thermo-gravimetric analyses. The polymer degradation may spread over a temperature range going, for example from 200 to 500° C., with one or more zones of degradation as a function of the nature of the degraded products. In the degradation zones, the temperature increase must be slow and progressive to avoid the accumulation of constraints and suppression on the parts which would lead to the formation of cracks, swelling, bubbles, distortion and the like. The speed of the temperature increase also depends on the thickness of the walls of the parts. Outside these degradation zones or in temperature areas where the loss of mass varies little (derived in relation to low or no temperature change), the heating may be accelerated. The complete debinding cycle may be optimized so that the shortest treatment results in debinded parts presenting no defects. As an example, the cycle lasts between 36 and 48 hours.

With the goal of completely eliminating the residual carbon, a debinding stage may be planned to take place with a reducing gas system, such as hydrogen or hydrogen mixed with nitrogen and/or argon, in order to accelerate the degradation of the carbonaceous compounds or an additional dosage treatment of the carbon residues in the presence of:

oxygen; in this case, the quantity of oxygen introduced must be controlled with great precision in order to avoid the oxidation of the metal; or carbon monoxide or carbon dioxide ; this dosage must also be carefully controlled since it also risks oxidizing the metal.

In order to consolidate the debinded part, it is subjected to a sintering cycle during which the part undergoes a temperature increase at a determined speed up to a temperature known as the sintering temperature, at which it remains for a specific time (the sintering stage). The sintering allows for the densification of the parts by suppressing the porosity left by the polymer once it has been degraded. This densification is accompanied by a modification of the part's dimensions, known as shrinkage, which is controlled by the sintering temperature and the duration of the stage. This sintering temperature depends on the nature and particle size of the powder and the desired final properties. In the event that deformations appear during the densification, it may be useful to perform intermediate stages used to stabilize the system at critical temperatures where specific physical phenomena occur (end of debinding, change of phase, disappearance of pores and the like). Between two stages, the speed of the temperature increases or heating ranges may be different and may be very slow if the physical phenomena resulting from the heating are too fast and poorly controlled. These specific zones may be determined by dilatometry experiments. In general, the sintering cycle includes at least one stage in addition to the sintering stage. As a function of the composition of the powder used, a sintering cycle may be adapted (with several heating speeds and stabilization stages) in order to allow for an optimum dissolution of the carbon and a minimal formation of carbides, which limit the constraints due to the densification and/or cooling to their maximum levels. Mechanical strength is directly related to the density of the finished part. The sintering temperature and the duration of the stage may be adapted as a function of the strength and/or shrinkage limitations during sintering.

Different speeds for temperature increases have been tested (1–2–5–10–20° C./minute) without showing notable consequences on the final properties of the product. Likewise, the tested durations of the sintering stage (1 hour-3 hours-5 hours) do not seem to modify the final properties of the metallic object. Typically, the speed of heating is 5° C./minute and the duration of the stage is 1 hour. This heating speed is relatively slow for sintering but allows for good homogenization of the support and the whole part.

It is clear that the higher the density, the greater the strength, but dimensional control is difficult. In fact, starting with a paste initially charged with about 55% by volume of metallic powder, linear shrinkage can reach close to about 20%. These observations demonstrate the interest in maximizing the resin charge in metallic powder from the start.

The sintering temperature is always lower than the melting point of the material and may, for example, correspond to approximately ¾ of the melting point of the material used. For example, with stainless steel (spherical particles <22 and <44 µm), the sintering stage may be performed at a temperature between 1,150 and 1,280° C. In most trials, with stainless steel <44 µm and for compositions containing from about 55 to about 58% by volume of metallic powders, the sintering temperature was between 1,200° C., with an observed linear shrinkage of between about 5 and about 8%, and 1,250° C. with an observed linear shrinkage of about 18%.

To avoid the oxidation of the metal, the sintering is performed in a neutral atmosphere, for example in argon or nitrogen, either in a reducing atmosphere, ideally in dry hydrogen or a hydrogen/nitrogen blend, or under vacuum. For stainless steel, the sintering stage may take place in argon, a 90/10 hydrogen/nitrogen blend or under a primary vacuum. In this specific latter case, a partial pressure of argon or nitrogen avoids the vaporization of elements such as chromium, at high temperatures. Nitrogen may create a nitride layer on the surface of the parts, which when poorly controlled, may lead to a heterogeneous microstructure. For titanium and its alloys, which are very sensitive to oxygen and carbon, the treatment is preferably performed under a secondary vacuum.

Deformation problems (vertical and horizontal distortions) during sintering may be attributed to heterogeneity of temperature (which may be due to the introduction of a cold liquefied gas) and of composition due to a non-uniform distribution of carbon residues. The oxidation of particles, during debinding, for example, may also cause differential shrinkage, which translates into constraints and deformations. Problems attributable to the furnace can be ruled out when working with an airtight furnace with a homogeneity of temperature lower than +/−10° C., preferably lower than +/−5° C.

With respect to stainless steel powders containing very little carbon, the dominant provider of carbon in the debinding step is hydrocarbon. For example, with product reference 316L in which [C]<0.03% of the quantity of carbon residue (in the form of a hydrocarbon), resulting from the debinding, although limited to about 0.4% by mass with respect to the mass of the resin of a paste according to the present invention, is predominant with respect to that contained in the initial composition of the steel particles forming the powder. This residual carbon is thus all the more difficult to solution heat treat and the excess has a tendency to form carbides, preferably chromium and molybdenum carbides which are distributed around the grains of steel, thus modifying the composition from a microscopic point of view and weakening the steel. The more carbides that are formed, the more difficult it is to control the homogeneity of the composition and the more the parts (especially those with variable geometries) risk being deformed. In order to stabilize the steel by avoiding the formation of chromium and molybdenum carbides (coming from the steel), in addition to appropriate sintering conditions, as described above, a paste composition including an additive forming a carbon collector may be provided, such as titanium, niobium, tungsten, vanadium, molybdenum or tantalum, associated or not with a prior thermal treatment, following the debinding stage.

In a steel with a higher carbon content, by several tenths of a percent, the final composition and microstructure of the steel are less sensitive to the contribution of carbon residues in low quantities, such as those on the order of about 0.4% with respect to the mass of the resin contained in the composition coming from the use of the paste composition according to the invention.

For the case of titanium and its alloys, which are very hungry for carbon and oxygen, the carbon itself in significant quantities is solution heat treated and limits the problems of heterogeneity. On the other hand the low quantity of oxygen, which may come from the degradation of the polymer is sufficient to weaken the material.

The present invention is further described in detail by means of the following Examples and Comparisons. All parts and percentages are by weight and all temperatures are degrees Celsius unless explicitly stated otherwise.

EXAMPLES

Examples of Paste Compositions

Unless indicated otherwise, the percentages are expressed by mass with respect to the mass of the resin.

Composition A resin: "Sartomer SR 355" (ditrimethylolpropane tetraacrylate), photoinitiator: "Irgacure 369" (2-benzyl-2-dimethylamino-1-(4-morpholinophenyl)-butanone-1), 1%, diluent: "Sartomer SR256" resin (2-(2-ethoxyethoxy)ethyl acrylate), 5% rheological control agent: "Disparlon D 6650," 10%, metallic powder: stainless steel 316HIC (<44 µm, melting point: 1370–1400° C.), 58% by volume/total volume.

Composition B resin: "Sartomer SR 355" (ditrimethylolpropane tetraacrylate), photoinitiator: "Irgacure 369" (2-benzyl-2-dimethylamino-1-(4-morpholinophenyl)-butanone-1), 1%, diluent: "Sartomer SR9003" resin (neopentyl glycol di-propoxylate diacrylate), 10%, rheological control agent: "Cray Vallac Super," 10%, metallic powder: TA6V (<44 µm, melting point 1600–1650° C.), 57.5% by volume of total volume.

Actual Duration of Heating Stages

The following cycle, with a total duration of approximately 40 hours, was performed on a debinding assembly for both compositions A and B, under a primary vacuum (between $10^{-2}$ and 10 mbar). The heating step includes a debinding step that encompasses rapid heating stages, slow heating stages and pauses as illustrated in Compositions A and B.

| Temperature range in ° C. | Ramp Up/Down Heating speed in ° C./min | Hold duration in minutes |
| --- | --- | --- |
| 20–160 | 1 | 180 min @ 160° C. |
| 160–270 | 1 | 0 min @ 270° C. |
| 270–360 | 0.1 | 0 min @ 360° C. |
| 360–420 | 0.1 | 180 min @ 420° C. |
| 420–520 | 0.2 | 360 min @ 520° C. |

It must be noted that the above cycle considers an inertia of approximately 50° C. between the reference temperature taken in the furnace enclosure and the actual temperature in the debinding enclosure. Thus the heating stage temperatures may vary according to the debinding assembly used. The heating speed depends on the thickness of the walls of the parts. The cycle described above is appropriate for maximum thicknesses of 4–5 millimeters. Beyond this, it is necessary to lower the heating speed in the critical zone by 270° C.–520° C.

Sintering Cycle for Composition A

The sintering stage was performed in argon.

| Temperature range in ° C. | Ramp Up/Down Heating speed in ° C./min | Hold duration in minutes |
|---|---|---|
| 20–500 | 5 | 30 min @ 500° C. |
| 500–650 | 5 | 30 min @ 650° C. |
| 650–850 | 5 | 30 min @ 850° C. |
| 850–1200 | 5 | 60 min @ 1200° C. |
| 1200–400 | 5 | 0 min @ 400° C. |
| 400–20 | | Natural cooling |

Sintering Cycle for Composition B

The sintering stage was performed under a secondary vacuum ($10^{-6}$–$10^{-4}$ mbar)

| Temperature range in ° C. | Ramp Up/Down Heating speed in ° C./min | Hold duration in minutes |
|---|---|---|
| 20–1250 | 5 | 60 min @ 1250° C. |
| 1250–400 | 5 | 0 min @ 400° C. |
| 400–20 | | Natural cooling |

The following compositions C, D, E and F were prepared and treated the same as compositions A and B above except described below.

| Composition C | |
|---|---|
| Original binder: | 38% vol. |
| Resin | SR355 |
| Photoinitiator | Irgacure 369 (1% wt./R) |
| Additive | Crayvallac Super (5% wt./R) |
| RMF1: | 62% vol. |
| 17-4PH +20–44 µm | 60% wt. |
| 17-4PH - 5 µm | 20% wt. |
| Fe - 2 µm | 10% wt. |
| NiB - 12 µm | 2.5% wt. |
| NiP - 5 µm | 7.5% wt. |
| Building | |
| Layer thickness | 25 µm |
| Scanning speed | <0.5 m/s |
| Debinding and full density sintering under Argon/Hydrogen (10%) | | |

| Temperature range in ° C. | Ramp Up/Down Heating speed in ° C./hour | Hold duration in hours |
|---|---|---|
| 20–50° C. | 15° C./h | 4 hrs @ 50° C. |
| 50–150° C. | 15° C./h | 4 hrs @ 150° C. |
| 150–450° C. | 15° C./h | 4 hrs @ 450° C. |
| 450–900° C. | 50° C./h | 2 hrs @ 900° C. |
| 900–1050° C. | 50° C./h | 4 hrs @ 1050° C. |
| 1050–1100° C. | 100° C./h | 0 hrs @ 1100° C. |
| 1100–600° C. | 100° C./h | 0 hrs @ 600° C. |

| Composition D | |
|---|---|
| Original binder: | 36% vol. |
| Resin | SR355 |
| Photoinitiator | Irgacure 369 (1% wt./R) |
| Additive | Crayvallac Super (5% wt./R) |
| RMF1: | 64% vol. |
| 17-4PH +20–44 µm | 60% wt. |
| 17-4PH - 5 µm | 20% wt. |
| Fe - 2 µm | 10% wt. |
| NiB - 12 µm | 2.5% wt. |
| NiP - 5 µm | 7.5% wt. |
| Building | |
| Layer thickness | 25 µm |
| Scanning speed | <0.5 m/s |
| Debinding and full density sintering under Argon/Hydrogen (10%) | | |

| Temperature range in ° C. | Ramp Up/Down Heating speed in ° C./hour | Hold duration in hours |
|---|---|---|
| 20–50° C. | 15° C./h | 4 hrs @ 50° C. |
| 50–150° C. | 15° C./h | 4 hrs @ 150° C. |
| 150–450° C. | 15° C./h | 4 hrs @ 450° C. |
| 450–900° C. | 50° C./h | 2 hrs @ 900° C. |
| 900–1050° C. | 50° C./h | 4 hrs @ 1050° C. |
| 1050–1100° C. | 100° C./h | 0 hrs @ 1100° C. |
| 1100–600° C. | 100° C./h | 0 hrs @ 600° C. |

The composition D is better than C in terms of recoating. The rheological additive helps prevent the flowing of the paste and the settling of the particles into the binding agent. The presence of NiB and NiP in compositions C and D allows decreasing the sintering temperature in comparison with A (stainless steel). The presence of Fe improves the surface finish quality and contributes also to a faster sintering. The UV reactivity of compositions C and D is very low because the small particles stop the penetration of the UV light into the paste. The building time is then very long with comparison with all other formulations.

| Composition E | |
|---|---|
| Original binder: | 44% vol. |
| Resin | SR355 |
| Photoinitiator | Irgacure 369 (1% wt./R) |
| Additive | Crayvallac Super (5% wt./R) |
| RMF5: | 56% vol. |
| 17-4PH +20–44 µm | 90% wt. |
| NiB - 44 µm | 2.5% wt. |
| NiP - 44 µm | 7.5% wt. |
| Building | |

-continued

| | Composition E |
|---|---|
| Layer thickness | 50 μm |
| Scanning speed | >2 m/s |

Debinding and full density sintering under Argon/Hydrogen (10%)

| Temperature range in ° C. | Ramp Up/Down Heating speed in ° C./hour | Hold duration in hours |
|---|---|---|
| 20–50° C. | 15° C./h | 4 hrs @ 50° C. |
| 50–150° C. | 15° C./h | 4 hrs @ 150° C. |
| 150–450° C. | 15° C./h | 4 hrs @ 450° C. |
| 450–900° C. | 50° C./h | 2 hrs @ 900° C. |
| 900–1050° C. | 50° C./h | 4 hrs @ 1050° C. |
| 1050–1100° C. | 100° C./h | 0 hrs @ 1100° C. |
| 1100–600° C. | 100° C./h | 0 hrs @ 600° C. |

Composition E has a better UV reactivity during the building step, which makes the process faster and easier to optimize. The presence of NiB and NiP allow decreasing the sintering temperature.

| Composition F | |
|---|---|
| Binder: | 42% vol. |
| Resin | SL5430 |
| Photoinitiator | UVI 6974 (3% wt./R) |
| Additive | CabOSil TS720 (5% wt./R) |
| RMF5: | 58% vol. |
| 17-4PH +20–44 μm | 90% wt. |
| NiB - 44 μm | 2.5% wt. |
| NiP - 44 μm | 7.5% wt. |
| Building | |
| Layer thickness | 50 μm |
| Scanning speed | <1 m/s |

Debinding and full density sintering under Argon/Hydrogen (10%)

| Temperature range in ° C. | Ramp Up/Down Heating speed in ° C./hour | Hold duration in hours |
|---|---|---|
| 20–150° C. | 60° C./h | 2 hrs @ 150° C. |
| 150–200° C. | 60° C./h | 2 hrs @ 200° C. |
| 200–500° C. | 10° C./h | 2 hrs @ 500° C. |
| 500–850° C. | 60° C./h | 2 hrs @ 850° C. |
| 8500–1050° C. | 60° C./h | 2 hrs @ 1050° C. |
| 1050–1075° C. | 25° C./h | 4 hrs @ 1075° C. |
| 1075–600° C. | 100° C./h | 0 hrs @ 600° C. |

Composition F has a worse UV reactivity than E but the green strength of the composite part is higher which permits easier cleaning of the parts. The shrinkage that occurs during the building step is also decreased by the use of epoxy-based systems. However the presence of epoxy groups in the composite part makes the debinding more difficult than with acrylates resins (compositions A to E). The sintered parts are cracked and oxidized. The presence of NiB and NiP permit decreasing the sintering temperature. The Theological additive CabOSil TS-720 can also be used with the acrylate based resin (SR355).

The mixing procedure remains the same for all of these formulations.

| Metal | Manufacturer |
|---|---|
| 316HIC | Hoganas (Sweden), Ultrafine Powder Technology (USA) |
| TA6V | Crucible Research (USA) |
| Copper | Eckart-Poudmet (France) |
| 17-4PH all particle sizes | Ultrafine Powder Technology (USA) |
| Fe - 2 μm | ISP Technologies (USA) |
| NiB - 12 μm | Ultrafine Powder Technology (USA) |
| NiP - 5 μm | Ultrafine Powder Technology (USA) |
| NiB - 44 μm | Protective Metal Alloys BROCO (USA) |
| NiP - 44 μm | Protective Metal Alloys BROCO (USA) |

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed:

1. A paste composition, including a binding agent charged with metallic powder, to be used in a solid freeform fabrication procedure, comprising:
    a) a solidifiable binding agent comprised of at least one polymerizable resin, with a viscosity of less than 4000 mPa.s, measured at 25° C.;
    b) at least one initiator, in a concentration greater than 0.1% by mass with respect to the mass of the resin; and
    c) a mixture of at least two metallic powders, said mixture having a volumetric concentration greater than 50% with respect to the composition, wherein said mixture of metal powders is either i) a bimodal or trimodal mixture of particles of different size, or ii) is a majority of stainless steel with an amount of NiB or NiP and combinations thereof effective to lower sintering temperature.

2. The composition according to with claim 1, wherein the resin does not contain a benzene ring.

3. The composition according to claim 1, wherein the resin is a photopolymer.

4. The composition according to with claim 3, wherein the resin is an acrylate type resin.

5. The composition according to claim 4, wherein the resin is ditrimethylol propane tetraacrylate resin.

6. The composition according to claim 1, wherein mixture of the metallic powders is present in a volumetric concentration greater than about 50% with respect to the composition and includes at least about 30% by volume of spherical particles with respect to the powder.

7. The composition according to claim 1, wherein mixture of the metallic powders is selected from the group of powders consisting of iron, steel, stainless steel, titanium, titanium alloy, copper, tungsten, tungsten carbide, nickel alloy, nickel boron, nickel phosphorus and blends thereof.

8. The composition according to claim 1, wherein each powder in the mixture of metallic powders has a particle size of less than about 45 μm.

9. The composition according to claim 1, wherein it additionally includes at least one of the following additives:
    a) a rheological control agent dispersed or dissolved in the resin in a concentration of about 1 to about 15% by weight with respect to the weight of the resin,
    b) a reactive or non-reactive diluent with a viscosity less than 100 mPa.s, in a concentration from about 2 to about 20% by weight with respect to the weight of the resin, c) an agent dissolved or not in the resin, allowing for the increase of the composition's reactivity with respect to illumination, d) a coupling agent in concentrations from about 0.1 to about 0.3% by weight with respect to the metallic powder, e) a wetting and/or dispersant agent in a concentration of less than about 1% by weight with respect to the metallic powder, f) a lubricant in a concentration of less than about 0.5% by weight with respect to the metallic powder, g) a carbon collector, h) an adhesive agent, or i) additives in the form of a metallic powder, presenting a melting point lower than that of the mixtures of metallic powders.

10. The composition according to claim 1, wherein the particles forming the metallic powder are coated in a coating which limits the absorption of light by the particles.

11. The composition according to claim 10, wherein the coating is comprised of a wax or a layer of oxidation formed by the oxidation of the particles forming the metallic powder.

12. The composition according to claim 1, wherein mixture of metallic powders is comprised of a homogenous blend of metallic powders, of the same nature or not, of at least two different particles sizes, with a particle size ratio of between about 10:1 and about 5:1.

13. The composition according to claim 1, wherein the initiator is a photoinitiator.

14. The composition according to claim 1, wherein the photoinitiator is an α-amino-ketone.

15. The composition according to claim 14, wherein the photoinitiator is 2-benzyl-2-dimethylamino-1-(4-morpholinophenyl)-butanone-1.

16. The composition according to claim 15, wherein it includes an activation agent such as isopropyl thioxanthone, 1-chloro-4-propoxythioxanthone, or 4-benzoyl-4'-methyldiphenyl sulfide, or a blend of at least two thereof, in combination with a co-initiator such as ethyl p-dimethylaminobenzoate.

17. The composition according to claim 1, wherein the initiator is a thermal initiator.

18. The composition according to claim 17, wherein the initiator is peroxide based.

19. The composition according to claim 17, wherein the initiator includes azo bis-iso-butronitrile.

20. The composition according to claim 18, wherein the initiator includes onium and pyridinium salts.

21. The composition according to claim 17, wherein the resin is an epoxy with a protected amine group.

22. The procedure for obtaining metallic products from the paste composition of claim 1, comprising the steps of:

a) forming a composite product comprised of thin superimposed layers of paste, obtained by the repetition of a cycle including the following stages:
transforming the layer which was just created by polymerization of the binding agent,
coating of the transformed layer by a new non-transformed layer, b) removing the polymer contained in the composite product obtained in the preceding step a) by a thermal treatment called the debinding step, and c) sintering the debinded metallic product obtained in the preceding step b).

23. The procedure according to claim 22, wherein during the forming step, the layers of paste created have a thickness of less than about 150 μm.

24. The procedure according to claim 22 wherein the debinding step is performed under a neutral or reducing gas system or under vacuum and may or may not be followed by an additional dosage treatment of carbon residues in the presence of oxygen, carbon monoxide or carbon dioxide.

25. The procedure according to claim 22, wherein the thermal cycle of the debinding step includes rapid heating stages in the temperature zones in which the binding agent degrades little or not at all and slow heating stages and pauses in the zones in which the binding agent is rapidly degraded, comprising a complete cycle with a duration of less than 48 hours.

26. The procedure according to claim 22, wherein the sintering stage induces the consolidation of the product by densification of the porous debinded product, at a temperature lower than the melting point of the metal.

27. The procedure according to claim 22, wherein the sintering stage is performed under a neutral or a reducing gas system or under vacuum.

28. The procedure according to claim 22, wherein during sintering stage, the thermal cycle includes rapid heating stages, greater than or equal to about 5° C./min, in temperature zones in which the debinded product does not undergo transformation and slow heating stages, less than or equal to about 1° C./min, or stabilization stages lasting less than 1 hour, in zones in which the debinded product undergoes physical transformations, and a sintering stage lasting between about 30 minutes and about 5 hours.

29. The debinded and sintered metallic product obtained by the procedure according to claim 22.

30. The product according to claim 29, wherein it presents less than about 2% by mass of carbon residue with respect to the mass of the resin in the initial composition.

31. The product according to claim 29, wherein it has temporary support elements, created in such a way that, in a radius of 1.5 mm, there are at least two distinct points pertaining to two distinct solidified support elements on a single layer in order to support the overhanging parts of the product.

* * * * *

UNITED STATES PATENT AND TRADEMARK OFFICE
CERTIFICATE OF CORRECTION

PATENT NO. : 6,630,009 B2
DATED : October 7, 2003
INVENTOR(S) : Khalil M. Moussa et al.

It is certified that error appears in the above-identified patent and that said Letters Patent is hereby corrected as shown below:

<u>Column 11,</u>
Line 27, should read -- spreading of the layers. A rheological control agent may be --.

<u>Column 19,</u>
Line 63, should read -- decreasing the sintering temperature. The rheological addi --.

Signed and Sealed this

Fifteenth Day of February, 2005

JON W. DUDAS
*Director of the United States Patent and Trademark Office*